United States Patent
Kinder et al.

(10) Patent No.: US 6,265,353 B1
(45) Date of Patent: Jul. 24, 2001

(54) DEVICE AND METHOD FOR PRODUCING A MULTILAYERED MATERIAL

(75) Inventors: Helmut Kinder, Freising; Markus Bauer, Neufahrn; Joachim Schwachulla, Munich, all of (DE)

(73) Assignee: Theva Duennschichttechnik GmbH, Freising (DE)

( * ) Notice: Subject to any disclaimer, the term of this patent is extended or adjusted under 35 U.S.C. 154(b) by 0 days.

(21) Appl. No.: 09/117,878

(22) PCT Filed: Dec. 8, 1997

(86) PCT No.: PCT/DE97/02868

§ 371 Date: Apr. 12, 1999

§ 102(e) Date: Apr. 12, 1999

(87) PCT Pub. No.: WO98/24944

PCT Pub. Date: Jun. 11, 1998

(30) Foreign Application Priority Data

| Jun. 5, 1996 | (DE) | 197 23 573 |
| Dec. 6, 1996 | (DE) | 196 50 567 |
| Oct. 24, 1997 | (DE) | 297 19 004 U |
| Oct. 24, 1997 | (EP) | 97118550 |
| Oct. 27, 1997 | (EP) | 97118653 |
| Nov. 21, 1997 | (DE) | 297 20 733 U |

(51) Int. Cl.$^7$ .............. B05D 5/12; B05D 3/06; C23C 16/00
(52) U.S. Cl. ............. 505/238; 427/62; 427/567; 427/566; 118/723 VE; 118/723 EB; 505/473; 505/480; 505/732
(58) Field of Search ............ 505/238, 473, 505/480, 732; 118/715, 723 VE, 118 EB; 427/62, 567, 566; 428/930, 702

(56) References Cited

U.S. PATENT DOCUMENTS

| 4,900,622 | 2/1990 | Nakayama et al. . |
| 5,004,721 | 4/1991 | DeLozanne . |
| 5,432,151 | * 7/1995 | Russo et al. ............ 505/474 |

FOREIGN PATENT DOCUMENTS

| 57-138058 | 8/1982 | (JP) . |
| 6-139541 | 5/1994 | (JP) . |

OTHER PUBLICATIONS

Fidikoglu et al, Appl. Phys. lett. 69(11) pp. 1626–1628, Sep. 1996.*

Appl. Phys. Left 69 (12), Sep. 16, 1996 entitled "High critical current density superconducting tapes by epitaxial deposition of YBa$_2$CU$_3$O$_x$thick films on biaxially textured metals" by A. Goyal et al.

* cited by examiner

Primary Examiner—Brian K. Talbot
(74) Attorney, Agent, or Firm—Crowell & Moring, L.L.P.

(57) ABSTRACT

In a method for producing laminate, a buffer layer is applied to a substrate, with the buffer layer material being evaporated from the buffer layer material dispensing devices at an angle $\alpha_1 \neq 0$ at the normal to the substrate surface onto the latter, before an oriented thin layer is evaporated. According to the invention, provision is made such that (a) following evaporation of the buffer layer and prior to the evaporation of the oriented thin layer, at least one cover layer is evaporated under deposition conditions that vary from those under which the buffer layer was applied, especially at a different pressure, different temperature, different rate, and/or different angle $\alpha_2 \neq \alpha_1$, especially $\alpha_2 < \alpha_1$, preferably $\alpha_2 \approx 0°$ to the substrate surface normal, and/or is evaporated on the buffer layer in such fashion that the buffer layer has a biaxial texture and/or facets.

32 Claims, 6 Drawing Sheets

DEVICE AND METHOD FOR PRODUCING A MULTILAYERED MATERIAL

BACKGROUND OF THE INVENTION

The invention generally relates to a laminate as well as a device and a method for manufacturing a laminate. More specifically, the invention relates to a laminate composed sequentially of an amorphous or polycrystalline substrate, a textured buffer layer, and an oriented oxide thin layer. The invention is also based on a device for manufacturing laminate with a vacuum chamber in which positioning devices for a substrate and buffer layer material dispensing devices for providing a buffer layer as a substrate for an oriented thin layer on the substrate are so arranged that buffer layer material is capable of being evaporated from the buffer layer material dispensing devices at an angle $\alpha_1 \neq 0$ to the normal to the substrate surface, onto the latter, as well as a method for manufacturing laminate whereby a buffer layer is applied to a substrate, with the buffer layer material being evaporated from the buffer layer material dispensing devices at an angle $\alpha_1 \neq 0$ to the normal to the substrate surface onto the latter, before an oriented thin layer is evaporated, as a way of manufacturing monocrystalline thin layers on polycrystalline or amorphous substrates.

To produce monocrystalline thin layers of a specific material, the material is generally applied to suitable monocrystalline substrates of another material. The substrates must have a suitable lattice structure in order to permit so-called heteroepitaxy, in which the monocrystalline structure of the substrate is assumed by the layer applied. This method is also used to produce thin layers of high-quality oxide high-temperature superconductors for example, such as $YBa_2Cu_3O_{7-d}$ (YBCO). In such superconductors, grain boundaries can drastically deteriorate the superconducting properties. Grain boundaries with a large grain boundary angle have a greater effect than those with a small angle between the crystal axes of the grains involved. The effect of the grain boundaries is obvious from a comparison of the critical current densities. This value is 3 to 5 $MA/cm^2$ in YBCO at 77K on monocrystalline substrates in an intrinsic magnetic field. Typically, only 0.02 $MA/cm^2$ is reached on nontextured substrates. For this reason, a monocrystalline structure of the superconductor is required when manufacturing high-quality, high-temperature superconductor layers.

The method of manufacturing high-quality superconductor layers by heteroepitaxial growth on monocrystalline substrates is limited to relatively small areas since such substrates are available only up to a very limited size. In addition, monocrystalline substrates are very expensive and therefore not economical in many cases. In particular it is not possible to make strips of monocrystals that are the prerequisite for power cables or wound magnets made of high-temperature superconductors.

Recently a number of approaches have been taken to circumvent the limitation to monocrystals. By using suitable methods, a quasi-monocrystalline or especially a biaxial texture is created in the substrate itself or in a buffer layer that is deposited on the substrate. This means that the crystal axes of the substrate or possibly of the buffer layer are aligned with a certain degree of unsharpness that is generally characterized by one or more half-width values. Then, in a second step for example, the superconductor is applied heteroepitaxially to this substrate or buffer layer. In this way, for example, improved superconducting properties are achieved, such as an increase in critical current density. This increases inversely with the half-width value or values of the buffer layer. Four important methods of producing a biaxial structure have been published.

Thus a method has been developed in which a biaxial texture is produced in nickel strips by multiple rolling followed by recrystallization (Rolling Assisted Biaxially Textured Substrates: RABiTS®), as published in A. Goyal et al., APL 69, Page 1795, 1996. However, a superconductor cannot be applied directly to these nickel strips since nickel does not have a substrate suitable for direct deposition of a superconductor due to diffusion and oxidation problems. Therefore a diffusion barrier is produced by a complex series of buffer layers grown epitaxially on it to produce a surface suitable for deposition of superconductors, on which surface the high-temperature superconductor layer then grows epitaxially. It is disadvantageous in this method that nickel is unsuitable for many applications because of its deficient tensile strength. In addition, the ferromagnetism of nickel is disadvantageous in applications involving a magnetic field.

In so-called "Ion Beam Assisted Deposition" (IBAD) according to Y. Iikama et al., APL 60, page 769, 1992, the buffer layer is bombarded with low-energy ions as it is being deposited on a substrate, at a sharp angle. $Y_2O_3$-stabilized zirconium dioxide (YSZ) is usually employed as the buffer layer material. This method allows biaxially textured layers of high quality to be produced that permit deposition of superconducting films for example with very good properties. However the cost of the apparatus is high because an ion source is used, the deposition rate is low, and the deposition area is limited by the ion source. These points are cost-intensive and make the IBAD method unsuitable for commercial applications.

Another method is laser deposition at sharp angles (Inclined Substrate Deposition: ISD) as described in K. Hasegawa et al., Proc. of ICEC 16, 1996, Kitakyushu, Japan, and EP 669 411 A2. Depending on the deposition conditions, during laser deposition on a noninclined substrate, a crystal axis is set perpendicular to the substrate surface and hence parallel to the deposition direction. If the normal of the substrate is then inclined relative to the deposition direction, this crystal axis follows the deposition direction. At a suitable inclination angle, a second crystal axis is also oriented parallel to the surface and the biaxial texture is obtained. However, the laser deposition method is less suited for economical large-area coating because of the limited size of the area that can be coated at one time.

Similarly, a biaxial texture has been produced in thin metal layers by evaporating aluminum from resistance-heated boats (ct. T. Hashimoto et al., Thin Solid Films 182, 197, 1989). A background pressure of $4 \times 10^{-5}$ mbar was used during deposition. The degree of texturing was poor, however. In addition, metals in general and aluminum in particular are not suitable as substrates for direct deposition of a superconductor because of diffusion and oxidation problems and a lack of thermal stability.

The goal of the present invention is to produce a laminate that is improved over the prior art and to improve devices and methods for manufacturing a laminate.

SUMMARY OF THE INVENTION

This goal is achieved by the features described herein for a laminate and a device and a method for manufacturing a laminate.

Thus, a laminate according to the invention with a sequence composed of an amorphous or polycrystalline substrate, a textured buffer layer, and an oriented thin layer is characterized by at least one cover layer being contained between the buffer layer and the thin layer.

The at least one cover layer according to the invention means that gaps and irregularities in the buffer layer caused by manufacture are smoothed out so that the oriented oxide thin layer has a high quality that corresponds to the surface of the cover layer that is available to it for growth, said quality being expressed in particular in a critical current density when the oriented thin layer is an oxide high-temperature superconductor thin layer. However, qualitatively improved layer structures are according to the invention are also achieved for other similar thin layers.

To the extent that reference has been made above and will be made below to high-temperature superconductors, this is to be understood as only an example. The invention is suitable without limit in general for any other oriented, preferably oxide or metal, thin layers that in particular can have a technical functional layer such as, in addition to an already mentioned high-temperature superconductor layer for example a YBCO layer, a ferromagnetic layer, including such a ferromagnetic layer with so-called "Giant Magneto Resistance," or a ferroelectric layer. Another possibility is to have a plurality of oriented thin layers placed one on top of the other above the at least one cover layer.

It is preferable for the material for the buffer layer to be evaporated onto the substrate surface at an angle $\alpha_1 \neq 0$ to the normal to the latter and preferably in addition for the material for the cover layer to be evaporated onto the buffer layer under deposition conditions different from those under which the buffer layer was applied, especially at a different pressure, a different temperature, a different rate and/or a different angle $\alpha_2 \neq \alpha_1$, preferably $a_2 < \alpha_1$, especially $\alpha_2 \approx 0°$, to the normal to the substrate surface. According to additional preferred embodiments, the buffer layer can have a biaxial texture and/or facets.

Preferably materials for the buffer layer and at least one cover layer contain oxide material including MgO, $CeO_2$, $Y_2O_3$ stabilized zirconium oxide (YSZ). Provision can also be made for the substrate to have a metal or metal alloy surface with an amorphous or polycrystalline structure that faces the oriented thin layer and is in particular polished and/or heat-resistant, whereby in particular the substrate itself and/or the surface contains thermally oxidized silicon, a nickel-based alloy such as Hastelloy C®, partially $Y_2O_3$ stabilized $ZrO_2$ (PSZ), heat-resistant stainless steel, platinum, and/or $Al_2O_3$, each in the polycrystalline or amorphous form. For example an untextured $Al_2O_3$ layer can form the surface of the substrate, thus acting as a protective layer. In this way for example a diffusion barrier layer including an oxidation barrier layer, a smoothing layer, and/or a layer with an adhesion promoter can be produced in an advantageous manner.

In a device for manufacturing laminate, with a vacuum chamber in which positioning devices for a substrate and buffer laminate material dispensing devices for forming a buffer layer as a substrate for an oriented oxide thin layer on the substrate are arranged in such fashion that buffer layer material can be evaporated from the buffer layer material dispensing devices at an angle $\alpha_1 \neq 0$ to the normal to the substrate surface, onto the latter, with such a device being referred to hereafter as according to the genus, the goal of the invention can be achieved by virtue of the fact that cover layer material dispensing devices for forming at least one cover layer as a substrate for the oriented thin layer on the buffer layer are provided as well as equipment by means of which the material for the cover layer can be evaporated onto the buffer layer under deposition conditions that are different from those under which the buffer layer was applied, especially at a different pressure, a different temperature, a different rate, and/or a different angle, whereby possibly the cover layer material dispensing devices in particular are arranged relative to the substrate positioning devices in such fashion that cover layer material can be applied to the buffer layer at an angle $\alpha_2 \neq \alpha_1$ preferably $\alpha_2 < \alpha_1$, especially $\alpha_2 \approx 0°$, to the substrate surface normal.

Further embodiments of the invention in terms of devices can include, as an alternative to or in addition to the above design, devices for thermal evaporation, especially electron beam evaporation or reactive evaporation, of buffer layer material, possibly of the cover layer material and/or the material for the oriented thin layer.

To achieve the goal that forms the basis of the invention, either together with each of the above embodiments or alone, a device according to the genus can be improved in such fashion that the angle $\alpha_1$ is larger, especially slightly larger, than an angle β that a crystal axis of the buffer layer material forms with the substrate surface normal, with another crystal axis of the buffer layer material being paralel to the substrate surface.

Another improvement on the device according to the genus is likewise suitable for achieving the goal of the invention, whereby devices for producing and maintaining a pressure that is higher by comparison to the rest of the vacuum chamber are provided in the vicinity of the application of the buffer layer material and possibly of the cover layer material and/or the material for the oriented oxide thin layer on the respective substrate. These features can possibly be combined with the above versions.

Instead of or in addition to the above-mentioned pressure increase, reactive materials or components such as radicals, ions, more reactive molecular compounds than those available or desired in the evaporated material are present in a layer formation area.

The simple pressure increase is generally viewed as a quantitative solution because of the large number involved and a simple use of reactive materials or components can be viewed as a qualitative solution because active particles are produced.

In a device according to the genus defined above, the goal of the invention can also be achieved alternatively or additionally by virtue of the fact that in the area where the buffer layer material, and possibly the cover layer material and/or the material for the oriented oxide thin layer, is applied to the respective substrate, devices are provided for adding components that are volatile during the evaporation of the respective material or materials and/or components that are required for producing the buffer layer and possibly the cover layer and/or the oriented oxide thin layer, and/or reactive components in gas form. A material supply of this kind is accomplished in particular by means of an area of increased pressure as described above. In addition to or instead of replacement of materials that are volatile during evaporation, materials are used by means of which reactive evaporation is achieved. For example a pure metal can be evaporated and oxygen can be added during the pressure increase so that an oxide layer is formed. As another example $H_2$ can be added in order to change the preferred growth directions. Generally speaking, a surfactant can be added.

Improvements on the devices according to the invention described above can comprise the following:

I. That the substrate positioning devices are possibly designed such that the substrate is located in a first layer formation area (a) inclined with respect to the horizontal such that the buffer layer material that rises at least approximately perpendicularly to the horizontal from the buffer layer material dispensing devices reaches the substrate in the first layer formation area at an angle $\alpha_1 \neq 0$ to the normal to the substrate surface, or (b) is located at least approximately parallel to the horizontal, and the buffer layer material dispensing devices are arranged relative to the first layer formation area such that buffer layer material that rises at an angle to the horizontal from the buffer layer material dispensing devices reaches the substrate in the first layer formation area at an angle $\alpha_1 \neq 0$ to the normal to the substrate surface, and/or II. That the substrate positioning devices are possibly so designed that the substrate with the buffer layer is located at an angle to the horizontal at least in a second layer formation area (a) so that cover layer material that rises at least approximately perpendicularly to the horizontal from the cover layer material dispensing devices reaches the buffer layer on the substrate at least approximately at an angle $\alpha_2$, preferably $\alpha_2 \neq \alpha_1$, especially $\alpha_2 < \alpha_1$, and preferably $\alpha_2 \approx 0$, to the normal to the substrate surface, or (b) is located at least approximately parallel to the horizontal, and the cover layer material dispensing devices are so arranged, and the cover layer material dispensing devices are so located relative to the second layer formation area, that cover layer material that rises at an angle to the horizontal from the cover layer material dispensing devices reaches the buffer layer on the substrate in the second layer formation area at least approximately at an angle $\alpha_2$, preferably $\alpha_2 \neq \alpha_1$, especially $\alpha_2 < \alpha_1$, preferably $\alpha_2 \approx 0°$ to the normal to the substrate surface.

Provision can be made for other advantageous improvements on the invention such that the substrate positioning devices contain a substrate holder for substrates moving on it and/or a substrate guide for substrates that are conveyed continuously in the form of strips or cables.

In particular, the devices for producing and maintaining a pressure that is higher than that in a conventional vacuum chamber can be arranged so that in a layer formation area or in an area where a layer or partial layer has already been formed, a pressure is maintained that is higher than that in the rest of the vacuum chamber, with particular provision being made for multiple passage through a pressure-increasing device and/or successive passages through a plurality of pressure-increasing devices with evaporation stations located in between.

It is also preferable for the pressure-increasing devices possibly to be so designed that they can produce, in a layer formation area or in an area where the layer or a partial layer has already been formed, a pressure of at least approximately $\geq 5 \times 10^{-4}$ mbar, especially at least approximately $\geq 1 \times 10^{-3}$ mbar relative to a pressure of approximately $\leq 1 \times 10^{-4}$ mbar, preferably $\leq 2 \times 10^{-5}$ mbar at the source.

Preferably, the above devices are designed for making laminates according to the invention.

The method produced by the invention is based on the following steps: application of a buffer layer to a substrate, with the buffer layer material being evaporated from buffer layer material dispensing devices at an angle $\alpha_1 \neq 0$ to the normal to the substrate surface onto the latter, followed by evaporation of an oriented thin layer on top of that.

On this basis, according to the invention, according to which, following the evaporation of the buffer layer and prior to the evaporation of the oriented thin layer, at least one cover layer is evaporated under deposition conditions that are different from those under which the buffer layer was applied, especially at a different pressure, a different temperature, a different rate and/or different angle $\alpha_2 \neq \alpha_1$, preferably $\alpha_2 < \alpha_1$, especially $\alpha_2 \approx 0°$, to the substrate surface normal, and/or onto the buffer layer in such fashion that the buffer layer has a biaxial texture and/or facets.

Alternatively or in addition, the buffer layer material, the cover layer material, and/or the material for the oriented oxide thin layer can be thermally evaporated for application to the respective substrate, for example by electron beam evaporation, or can be applied reactively.

Further approaches to achieving the goal of the invention consist in angle $\alpha_1$ being larger, especially slightly larger than an angle $\beta$ that a crystal axis of the buffer layer material forms with the substrate surface normal, with another crystal axis of the buffer layer material being parallel to the substrate surface.

In addition, the method according to the invention can include, in addition to the basic steps, a pressure that is higher by comparison to the other vacuum conditions prevailing in the area of application of the buffer layer material and possibly the cover layer material and/or the material for the oriented oxide thin layer on the respective substrate.

Of course it is also possible to achieve the goal of the invention in such fashion that in the area of application of the buffer layer material and possibly the cover layer material and/or the material for the oriented oxide thin layer, volatile components and/or components required for producing the buffer layer, possibly the cover layer, and/or the oriented oxide thin layer and/or reactive components in gas form is/are added to the respective substrate during evaporation of the respective material or materials.

As regards the pressure increase and/or the presence of certain materials or particles in the layer formation area, reference is made regarding the possibilities and effects to the corresponding information above in the description of the corresponding device features.

These methods can also be improved by the oriented thin layer being an oxide or metal thin layer and/or a technical functional layer, especially a high-temperature superconductor layer, preferably a YBCO layer, a ferromagnetic layer, including such a ferromagnetic layer with so-called "giant magneto resistance," or a ferroelectric layer, and in that preferably a plurality of oriented thin layers are applied one over the other on top of the at least one cover layer.

Other improvements in the method provide that the buffer layer and/or at least one cover layer contain oxide material including MgO, $CeO_2$, $Y_2O_3$ stabilized zirconium oxide (YSZ) or at least consist largely of these materials and/or that the substrate has a metal or metal alloy surface facing the oriented thin layer and being in particular polished and/or heat-resistant, said metal or metal alloy surface having an amorphous or polycrystalline structure, whereby preferably the substrate itself and/or the surface contains or contain thermally oxidized silicon, a nickel-based alloy such as Hastelloy C®, partially $Y_2O_3$ stabilized $ZrO_2$ (PSZ), heat-resistant stainless steel, platinum, and/or $Al_2O_3$, each in a polycrystalline or amorphous form.

Possible improvements in the above methods can consist firstly in arranging the substrate at least in a first layer formation area (a) at an angle to the horizontal such that buffer layer material that rises at least approximately perpendicularly to the horizontal from the buffer layer material dispensing devices reaches the substrate in the first layer formation area at an angle $\alpha_1 \neq 0$ to the normal to the substrate surface or (b) is located at least approximately parallel to the horizontal and buffer layer material is evaporated relative to the first layer formation area in such fashion that buffer layer material that rises at an angle to the horizontal from the buffer layer material dispensing devices reaches the substrate in the first layer formation area at an angle $\alpha_1 \neq 0$ to the normal to the substrate surface, and/or that on the other hand the substrate together with the buffer layer is located at an angle to the horizontal in at least one second layer formation area (a) such that the cover layer material that rises at least approximately perpendicularly to the horizontal from the cover layer material dispensing devices, in the second layer formation area, reaches the buffer layer on the substrate at least approximately at an angle $\alpha_2$, preferably $\alpha_2 \neq \alpha_1$, especially $\alpha_2 < \alpha_1$, preferably $\alpha_2 \neq 0°$ to the normal to the substrate surface, or (b) is located at least approximately parallel to the horizontal, and cover layer material is evaporated relative to the second layer formation area such that cover layer material that rises at an angle to the horizontal from the cover layer material dispensing devices in a second layer formation area reaches the buffer layer on the substrate at least approximately at angle $\alpha_2$, preferably $\alpha_2 \neq \alpha_1$, especially $\alpha_2 < \alpha_1$, preferably $\alpha_2 \neq 0°$ to the normal to the substrate surface.

It is also possible in the method according to the invention that substrate material in the form of strips or cables can be conveyed continuously or that a substrate is mounted movably.

Provision can also be made within the framework of the invention such that, possibly in a layer formation area or in an area where the layer or a partial layer has already been formed, a pressure is produced or maintained that is higher than under usual vacuum conditions, whereby in particular multiple passages are made through a pressure-elevating device and/or successive passages are made through a plurality of pressure-elevating devices with evaporating stations located in between.

Further alternatives to or combinations with the above variations can be achieved in a method according to the invention by possibly providing, in a layer formation area or in an area where a layer or partial layer has already been formed, a pressure of at least approximately $\geq 5 \times 10^{-4}$ mbar, especially at least approximately $\leq 1 \times 10^{-3}$ mbar, relative to a pressure of approximately $\leq 1 \times 10^{-4}$ mbar, preferably $\leq 2 \times 10^{-5}$ mbar at the source.

Preferably the methods according to the invention serve to produce the laminate described at the outset.

In the case of the laminate as well as the manufacturing device and the manufacturing method for the laminate, a simple and rapid, i.e. economical manufacture of textured buffer layers for superconductor coating is made possible. In addition, the buffer and cover layers can also be applied over large areas continuously. Furthermore, the texture can be applied to a biaxially textured surface on the superconductor.

Further advantageous and preferred embodiments of the invention follow from the claims and their combinations.

The invention will now be described with reference to the drawing in greater detail in conjunction with embodiments.

DETAILED DESCRIPTION OF THE DRAWINGS

The method of thermal evaporation is generally employed in a vacuum system for a deposition of layers. During thermal evaporation the evaporated material is evaporated by heating. Heating is achieved for example by heating a so-called boat using electric current and resistance. The evaporating material in the boat is thus heated to the point where it evaporates.

Figure 1:
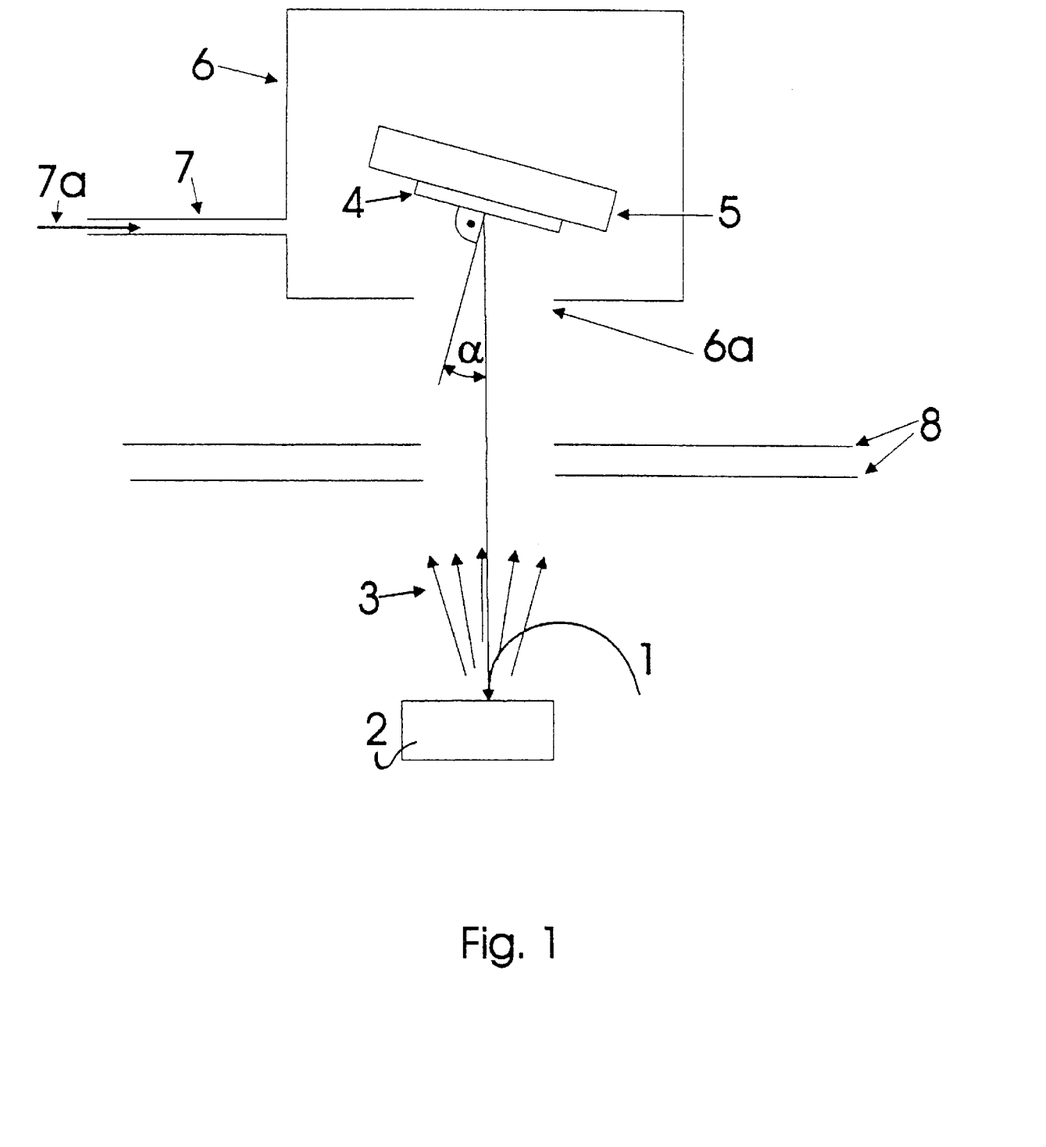
FIG. 1 is a schematic view of a system that uses the method of inclined evaporation.

Another method of thermal evaporation is electron beam evaporation which is described in the following without limiting its general nature (see FIG. 1). For this purpose, a high-energy electron beam 1 is fired at evaporation material (target) 2 in a vacuum chamber (not shown), so that material 2 is heated and evaporates, as indicated by arrow 3. Pure metals or compounds can be used as evaporating materials. In a special example, MgO or CeO$_2$ is used as the target material. The substrate 4 to be evaporated is placed above target 2 and can be raised to the required temperature by means of a heater 5. Without limiting the general nature, in FIG. 1 a block is shown as heater 5 to which substrate 4 is clamped and which is heated to the required temperature. Other arrangements are also possible, for example indirect radiant heating. Instead of heating, the substrate can be cooled and the deposition conditions influenced accordingly.

Substrate 4 is fastened in such fashion that the substrate normal and the connecting line between substrate 4 and target 2 forms an angle $\alpha$. The angle $\alpha$ then stands either for the angle $\alpha_1$ at which buffer layer material is evaporated or for the angle $\alpha_2$ at which cover layer material is evaporated.

Thus, the system has the general consequence that the evaporated material strikes the surface at approximately an angle $\alpha$. Since the impact angle of the evaporated buffer material on the surface produces the biaxial texture described below, the substrate does not have to be located vertically directly above the target as shown in FIG. 1 but can also be mounted offset laterally.

Gas can be admitted in the vicinity of substrate 4. During the deposition of oxides for example, oxygen can be admitted as a reactive gas in order to obtain the desired degree of oxidation or, during the evaporation of pure metal from target 2, a metal oxide layer can be produced by adding oxygen to substrate 4.

The pressure on substrate 4 of approximately $1\times10^{-3}$ mbar required to produce the layer is so high that when a corresponding amount of gas is admitted at a background pressure the material evaporated from target 2 is scattered within a few centimeters. If such a pressure were to prevail in the vacuum chamber in general, this would lead to a drastic drop in the evaporation rate and to a loss of the directional characteristics of the evaporation beam. Both would prevent the production of layers with good biaxial texture. Moreover, the source can no longer be operated in this pressure range when reactive gases in general and oxygen in particular are used. For this reason, a pressure increase at substrate 4 is generally preferable.

To increase the pressure, substrate 4 in particular is surrounded by a cage 6 into which the corresponding gas is introduced in the direction indicated by arrow 7a through a suitable line 7. Substrate 4 is evaporated through an opening 6a in the bottom of cage 6. In addition, by partial pumping produced by one or more partitions 8 and a corresponding system of vacuum pumps (not shown), a pressure gradient can be established between target 2 and substrate 4 so that the partial pressure of the reactive gas at the source and between target 2 and substrate 4 is reduced further.

The arrangement shown in the drawing represents only one possibility for increasing the pressure. In theory, all other methods conventionally employed in technology or in devices of this kind may be used that are compatible with this method.

Additional possibilities for providing evaporation material sources, a substrate, and pressure increase ranges are given in the older applications DE 196 31 101.1 as well as DE 196 80 845.6 (corresponding to PCT/DE 96/02096), whose disclosure contents are hereby incorporated by reference completely into the present documents. The examples that can be derived from this relate to variations in which a pressure increase was accomplished together with a chronological separation of oxidation and coating. For this purpose, a fixed (DE 196 80 845.6) or movable (DE 196 31 101.1) oxygen pouch at least mostly sealed was mounted on an especially movable substrate so that areas in which evaporation took place were then covered by the oxygen pouch. This allows increasing the pressure and supplying gas even without influencing the evaporation itself.

Without limitation, inclined evaporation can also be accomplished, instead of by using a substrate mounted at an angle to the evaporation material sources, in such fashion that the evaporation material sources are each disposed on the substrate offset laterally in suitable fashion from the layer formation area so that it is not the material that rises vertically, but the material that evaporates away laterally from the evaporating material sources that strikes the substrate at the desired angle. In the case of a substrate that is moved in a horizontal plane, in this way a different angle can be set by layer formation areas directly adjacent to one another for the buffer layer and each cover layer. In other words, if for example the buffer layer and the cover layers are made of the same materials, use is made of the fact that initially the vapor striking at an angle $\alpha_1$ strikes a layer formation area that is located laterally with respect to the evaporation material source for the buffer layer material and then, immediately thereafter, at an angle $\alpha_2<\alpha_1$ material vapor strikes a layer formation area that is located less laterally with respect to the evaporating material source for the cover layer material (identical to the buffer layer material). Possibly an intermediate area can be covered by screens between the two layer formation areas.

The method of thermal evaporation and especially of thermal evaporation by electron beams has several advantages over other methods for layer formation, as for example laser ablation which is known from the prior art (see EP 669 411 A2). As a result of the high thermal heating power available during thermal evaporation, very high evaporation rates can be achieved during continuous operation. These are necessary for the alignment of the layers as explained in greater detail below. Moreover the distance from the target to the substrate is theoretically unlimited so that large areas can be coated simultaneously. The target material can be topped up without any difficulties, since it is simply loaded into an evaporation crucible for example. This is also possible in a vacuum using automatic topping up devices. In this way continuous coating of large areas is possible without having to interrupt the vacuum. The advantages listed above for thermal evaporation contribute to the economic nature of the method and are not provided in other deposition methods.

If the system described above is used for deposition on an inclined substrate under certain deposition conditions such as a deposition rate, inclination angle $\alpha_1$, substrate temperature, partial pressure, and type of gas, a layer of deposition material is obtained (buffer layer) that is textured in a certain way. If the deposition conditions are chosen differently, differently textured layers are obtained.

Within the scope of the present invention it was discovered that in order for example to produce a biaxial structure in metal oxide layers, the above-mentioned deposition conditions, especially the deposition rate, substrate temperature, partial pressure, and type of gas can be chosen in such fashion that facets form on the growing microcrystallites. The term facet formation means that the surface of the crystallites of the applied layer consists essentially of approximately flat surfaces that usually constitute low-indexed crystal surfaces (for example {100}, {110}, (111)) which can also be inclined slightly (vicinal surfaces). Facets form in particular because a sufficiently high pressure of a suitable gas or gas mixture prevails at the substrate and a sufficiently high deposition rate is being used. If this is the case, a biaxial texture is achieved even at very low angles $\alpha_1$, typically beginning at 10°.

The mechanism of texture formation can be explained as follows. If deposition is performed under these deposition conditions on a substrate inclined at angle $\alpha_1$, those crystallites with the highest local rate will be evaporated whose uppermost facet has a surface normal that points approximately in the deposition direction. These crystallites consequently grow the strongest. As a result of mutual shading during inclined deposition and directional deposition, a crystal axis is already aligned or marked. The term directional deposition in the present case means that the impacting atoms or molecules have a momentum with a lateral component that results in a preferential direction of diffusion. In addition, an isotropic growth rate leads to the alignment of the second axis. In this way biaxially textured thin layers are obtained. The quality of the biaxial texture increases as a result of growth selection by shadowing with increasing layer thickness.

Figure 2:
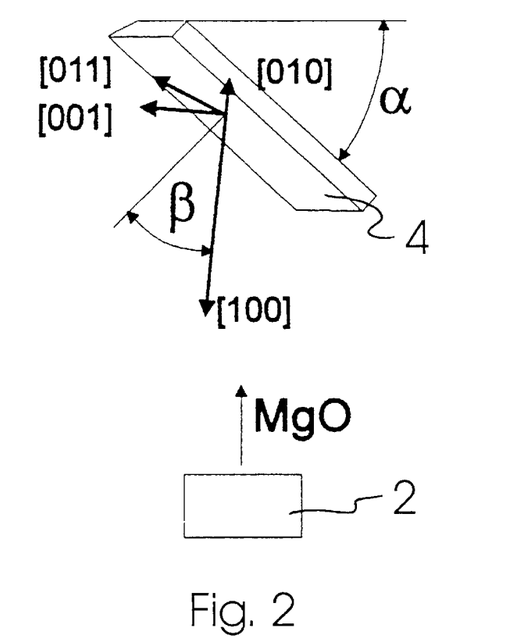
FIG. 2 shows an orientation of MgO layers produced by inclined evaporation.

The texture can generally be described as follows. A crystal axis [hkl] (for example {100}) becomes established more or less in the deposition direction. Additional equivalent crystal axes corresponding to the crystal symmetry (for example [010], [001]) become established approximately parallel to the surface (FIG. 2). Which equivalent crystal axes are distinguished in this manner depends on the deposition material and the deposition parameters. As a result, for example in the case of MgO being used as the buffer layer material, the [0–11] direction (or analogously the [01–1] direction) becomes parallel to the substrate surface and perpendicular to the crystal axis [hkl], for example [100], and thus becomes established more or less in the deposition direction.

In contrast, in deposition on substrates that are not inclined during deposition ($\alpha 1=0°$) or are inclined only slightly, a different orientation of the (buffer) layer (growth regime II) is obtained. Depending on the deposition conditions selected, a certain crystal axis <hkl> points in the normal direction. This crystal axis is not necessarily the one that is distinguished in growth regimen I in the manner described above. The change from growth regime I to growth regime II takes place with deposition conditions otherwise unchanged, starting at a certain inclination angle or a certain deposition rate, and a transitional area involving portions of growth regime I and growth regime II can develop. Deposition parameters such as the pressure and substrate temperature influence the transition. In this way, this method differs considerably from the method of laser ablation described above on a inclined substrate (lSD), since in the latter a certain crystal axis always becomes established approximately in the deposition direction, i.e. even with perpendicular deposition (cf. EP 669 411 A2).

The mechanism described above is of a basic nature so that for example biaxially oriented layers can basically be produced with many materials. Then, as the result of the selection of suitable deposition parameters, facets form on the growing microcrystallites. Concrete data for MgO and $CeO_2$ for example are given below.

By a suitable choice of deposition parameters it is possible as described above for example in the case of MgO to produce a biaxially textured buffer layer which for example has a crystal orientation suitable for YBCO. This is marked by the fact that the [100] crystal axis of the buffer is inclined as little as possible relative the substrate normal and the biaxial texture is as good as possible.

During direct deposition of a superconductor on the MgO buffer layers described above, the semiconductor does not grow epitaxially because of an insufficient crystallinity of the surface and because of the high porosity of the buffer layer.

For this reason, before the deposition of the superconductor, one or more additional cover layers are applied epitaxially to the existing biaxially textured buffer layer. These additional layers generally consist of any material suitable for the deposition of a superconductor. In a special example, MgO was used. By a suitable choice of material and deposition conditions, including rate, substrate temperature, and inclination angle $\alpha_2$, a surface was produced that was suitable for the growth of the superconductor layer. In particular, by using perpendicular deposition $\alpha_2=0$ or deposition at small inclination angles $\alpha_2$ of the buffer layer material as the cover layer, the pores in the buffer layer are closed so that it forms a better diffusion barrier between the superconductor and the substrate material for example and results in a closed surface layer. This additional cover layer or layers can be produced in the same or in another coating system. Advantageously the coating process without the substrate is exposed from time to time to the ambient air since this can lead to the degradation of the buffer and cover layers.

Figure 4:
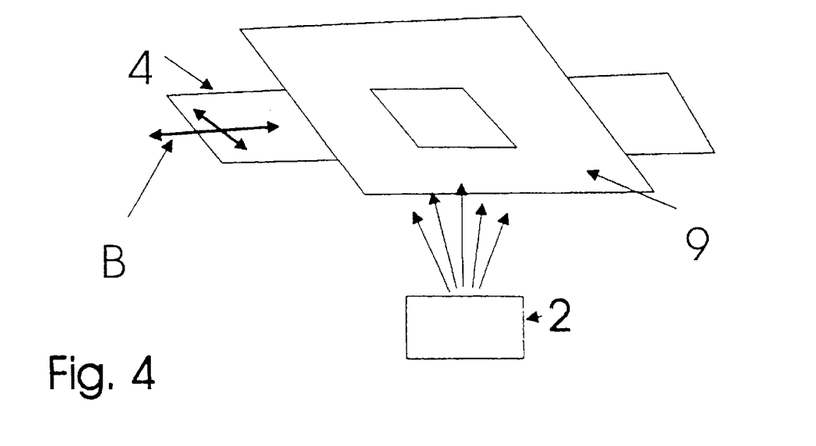
FIG. 4 is a schematic view of a system for coating on a moving substrate.

The method described above for producing a biaxially textured buffer layer and for producing cover layers on this buffer layer, as shown in FIG. 4, can be designed so that substrate 4 is moved opposite target 2, in one or two directions according to arrows B, permitting continuous coating of a large-area or strip-shaped substrate. The layer to be coated is limited by a suitable screen 9 to the desired area so that the angle $\alpha$ (corresponding to the buffer or cover layer $\alpha_1$ or $\alpha_2$ to be applied) can be defined with sufficient accuracy.

Figure 5:
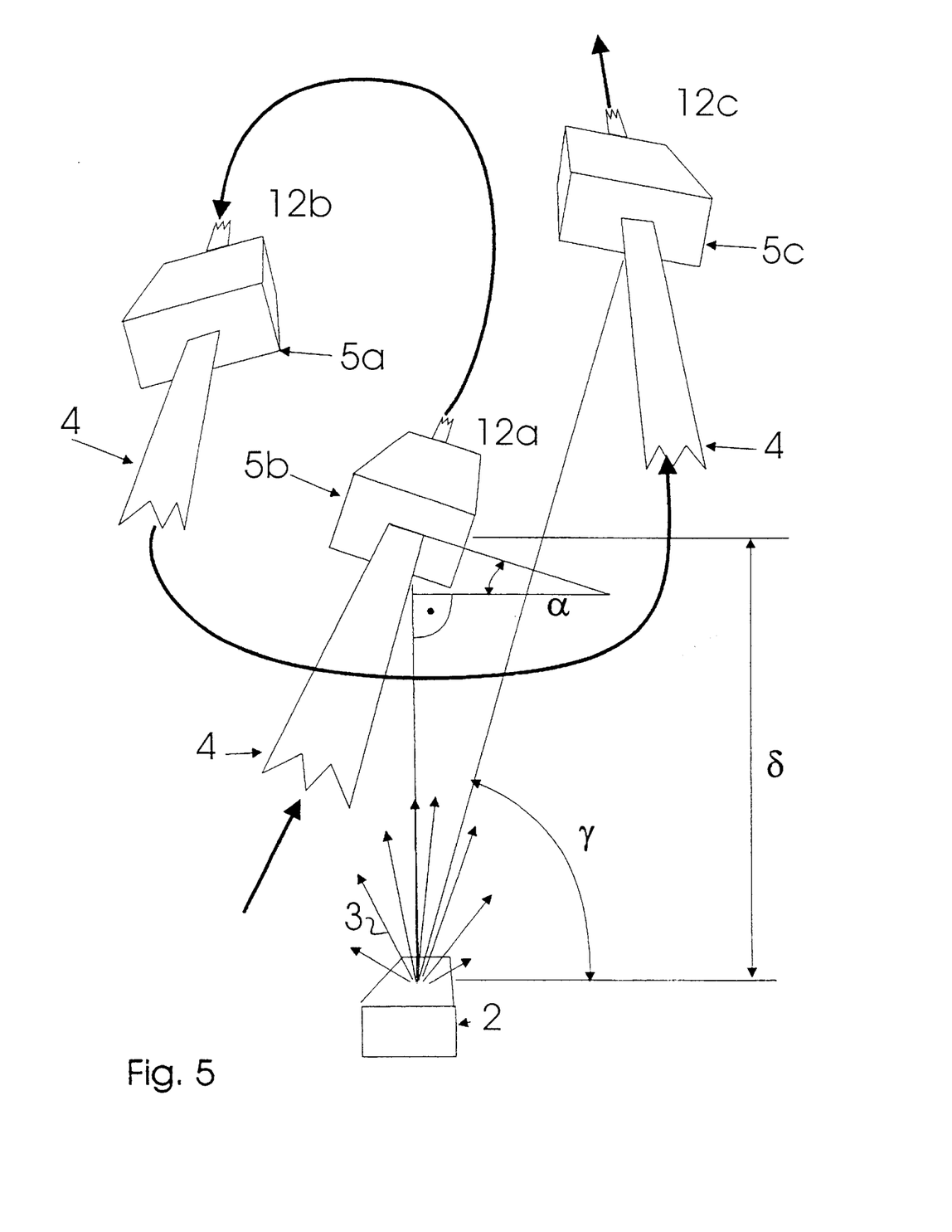
FIG. 5 is a diagram of a system for simultaneous application of a plurality of layers to a strip, using a source.

In general it is also possible to coat several substrates or parts of a substrate in parallel. Without limitation of the many possible arrangements, an embodiment is shown in FIG. 5. For this purpose, in general, layers are produced at various locations in the vacuum chamber by evaporation from a single source 2. In particular, a strip-shaped substrate 4 can be transported successively to various coating locations 12a (buffer layer application), and 12b to 12c (application of cover layers). By utilizing the entire vapor propagation cone (represented by arrow 3) and by varying the distance δ or the direction to the target surface γ, the desired rate can be chosen, and the desired temperatures can be selected by varying the local heating conditions of heaters 5a to 5c. At the various coating locations, substrate 4 can be coated at different deposition angles (for example only angle $\alpha_1$, is indicated at evaporation location 12a, while it is clear from the view in FIG. 5 that substrate 4 is at different angles $\alpha$ to target 2 at the other evaporation locations 12b and 12c). Thus, particularly in the case of a strip material, the production of several layers as a buffer layer and cover layers of the same material is possible on a strip during one coating process.

For subsequent application of thin layers of a high-temperature superconductor in general and YBCO in particular, in theory all conventional methods of thin layer manufacturing that are compatible with the substrate material may be used. Such methods include thermal co-evaporation, laser ablation, high-pressure and low-pressure sputtering, or MOCVD.

Thermal co-evaporation is suitable for large-area deposition at high rates and will be described briefly below. The substrate is placed together with the buffer layer and possibly the cover layers in a suitable vacuum chamber (not shown). It is also advantageous in this connection to expose the coating without the substrate intermittently to the ambient air since this can result in degradation of the buffer layer or possibly the cover layer. In the event of thermal co-evaporation of YBCO the metals Y, Ba, and Cu are then evaporated from resistively-heated so-called boats, with regulation of the evaporation rate. The substrate is located above the evaporator sources and is heated to approximately 680° C. When the oxygen pressure on the substrate is sufficiently high and the stoichiometry of the metals is correct, YBCO grows on the buffer layer.

The buffer and possibly the cover layer production and HTSL coating on substrates and especially strips can also be produced in the same sequence in the same coating chambers, with separate evaporator sources being used for the buffer layer and possibly cover layers and HTSL. The layer thicknesses can then be adjusted by choosing the evaporation rate, by screening, or by varying the distances between the source and the substrate, as well as by changing the throughput rate of the substrate.

The crystal directions and planes are designated using the Miller indices h, k, and l. [hkl] refers to a certain crystal axis, <hkl> refers to all of the crystal axes that are equivalent because of crystal symmetry, (hkl) is a certain crystal plane, and {hkl} stands for all of the crystal planes that are equivalent because of crystal symmetry.

EXAMPLES

1. MgO Simple Coatings:

Coatings of MgO on $SiO_2$/Si (thermally oxidized silicon) substrate are produced by electron beam evaporation. The growth rate is between 20 and 40 Å/s. The partial pressure of $O_2$ on the substrate was approximately $1\times10^{-3}$ mbar. The substrate temperature was varied between room temperature and 710° C.

With a sufficiently large inclination angle $\alpha_1$ the orientation of the evaporated layer (growth area 1) shown in FIG. 2 is seen. The [100] axis is in the plane that is spanned by the substrate normal and the deposition direction and forms inclination angle $\beta$ with the substrate normal. The [010] and [001] axes are aligned and point upward so that the [011] direction likewise lies in the abovementioned plane. This plane constitutes the (0–11) crystal plane, in other words the [0–11] crystal axis is parallel to the substrate surface and perpendicular to the [100] axis. The quality of the biaxial texture was determined with the aid of x-ray pole figure measurements of the MgO-(200) reflex. As a measure of the monocrystalline quality of the layers, the half-width value $\Omega$ of the [010] and [001] reflexes are given perpendicularly to the [100] direction.

By varying the deposition parameters—coating rate, substrate temperature, oxygen partial pressure on the substrate, and evaporation direction or inclination angle $\alpha_1$ of the substrate, the inclination angle $\beta$ and the half-width value $\Omega$ can be varied over a wide range. Selected dependencies are shown below.

TABLE 1

Angle $\beta$ and half-width value $\Omega$ of MgO layers produced at a inclination angle $\alpha_1$ of 55° and various substrate temperatures.

| Temperature | $\beta$ | $\Omega$ |
|---|---|---|
| 25° C. | 38° | 8° |
| 300° C. | 30° | 12° |
| 530° C. | 24° | 25° |

TABLE 2

Inclination angle $\beta$ and half-width value $\Omega$ of MgO layers produced at a substrate temperature of 300° C. at various inclination angles $\alpha$:

| $\alpha$ | $\beta$ | $\Omega$ |
|---|---|---|
| 20° | 19° | >40° |
| 30° | 17.5° | 40° |
| 40° | 20.5° | 20° |
| 55° | 30° | 12° |

At a fixed inclination angle of $\alpha_1$=55°, the inclination angle $\beta$ and the half-width value $\Omega$ depend on the substrate temperature in such fashion that as the substrate temperature increases, the inclination angle $\beta$ decreases and the half-width value $\Omega$ increases as shown in Table 1.

Similarly, with an increase in inclination angle $\alpha_1$ an increase in angle $\beta$ and a decrease in half-width value $\Omega$ was measured, as shown in Table 2.

The half-width value $\Omega$ decreases inversely with layer thickness as shown in Table 3. Inclination angle $\beta$ on the other hand shows no dependency pf layer thickness.

TABLE 3

Inclination angle $\beta$ and half-width value $\Omega$ of MgO layers as a function of layer thickness. The layers were produced at a substrate temperature of 300° and a inclination angle $\alpha_1$ of 35°.

| Temperature | $\beta$ | $\Omega$ |
|---|---|---|
| 80 | 25° | 60° |
| 160 | 27° | 45° |
| 325 | 26° | 24° |
| 625 | 22° | 12° |
| 1,265 | 23° | 8° |

During deposition on an approximately perpendicular substrate ($\alpha_1$=0°) at substrate temperatures from room temperature to 530° C., the <111> axis is directed perpendicularly to the surface. This corresponds to growth area II. This means that with perpendicular deposition the <111> axis is marked. At a substrate temperature of approximately 700° C., polycrytalline growth was observed without preferential orientation.

2. YBCO on MgO Buffer/Cover Layer Packets:

The biaxially texture MgO layers described above are suitable for example as buffer layers on polycrystalline or amorphous substrates for the deposition of HTSL thin layers in general and YBCO in particular. Polished polycrystalline, partially $Y_2O_3$ stabilized $ZrO_2$ (PSZ) was used as the substrate material. A buffer layer followed by two cover layers (MgO1 to MgO3) and the YBCO layer were applied on top of one another on this polycrystalline substrate.

The first buffer layer made of MgO (MgO1) was produced using the method of inclined evaporation described above. For superconductor layers with high critical current densities $j_c$ this buffer layer must have a small half-width value $\Omega$ and a small inclination angle $\beta$. This is accomplished with thick layers which are evaporated at small inclination angles $\alpha_1$. For this reason, inclination angles of $\alpha_1$=15° and $\alpha_1$=25° were used. The substrate temperature was 25° C., the oxygen pressure at the substrate was approximately $1\times10^{-3}$ mbar, and the evaporation rate in the substrate normal direction was 4 nm/s. A layer thickness of approximately 2 μm was applied.

Then the substrate was placed horizontally ($\alpha_2$=0°) in a heater and heated to 700° C. in a vacuum. This was followed by deposition of two cover layers made of MgO, hereinafter called MgO2 and MgO3, on the already existing buffer layer (MgO1). 500 nm was deposited at 0.5 nm/s for the MgO2 layer. Then 100 nm were evaporated at 0.1 nm/s for the MgO3 layer. The MgO2 and MgO3 layers grew epitaxially on MgO1. They closed the gaps in this layer that resulted from the inclined deposition and produced a surface suitable for epitaxial growth of YBCO. To determine the texture of the buffer and cover layers, pole figures of the (200) reflection of the MgO layer packet (MgO1, MgO2, and MgO3) were prepared. The values thus determined for the half-width value $\Omega$ and the inclination angle $\beta$ are shown in Table 4.

TABLE 4

Results of the deposition of YBCO on MgO buffer and cover layer packets

| Sample No. | Inclination angle $\alpha_1$ | Inclination angle $\beta$ of MgO layers | Half-Width Value $\Omega$ of MgO Layers | $j_c$ (77K) in A/cm$^2$ |
|---|---|---|---|---|
| 1 | 15° | 19° | 10° | 2.8 × 105 |
| 2 | 25° | 25° | 7° | 1.4 × 105 |

Finally the superconductor layer was applied using the method of thermal co-evaporation. The substrate temperature was 680° C. and the oxygen partial pressure at the substrate was approximately 7×10$^{-3}$ mbar. The layer thickness was 550 nm. The orientation of the superconductor layer is as follows. The [001] axis of the superconductor is oriented approximately parallel to the [100] axis of the MgO buffer. The [100] and [010] axes (a- and b-axes) of YBCO are parallel to the [010] and [001] axes of MgO located approximately in the substrate plane.

The superconductor layers thus produced have critical current densities above 0.1 MA/cm$^2$ at 77K at a maximum $j_c$ of 0.28 MA/cm$^2$ (see Table 4). This value is more than an order of magnitude higher than the critical current density of YBCO films on untextured substrates. Therefore there was a definite increase in critical current density.

3. CeO$_2$:

Layers of CeO$_2$ were produced on substrates of SiO$_2$/Si and the nickel-based alloy Hastelloy C® by electron beam evaporation. The growth rate was 40 Å/s. The partial pressure of O$_2$ on the substrate was 4×10$^{-4}$ mbar.

TABLE 5

Inclination angle $\beta$ and half-width value $\Omega$ of CeO$_2$ layers produced at various substrate temperatures.

| Temperature | $\beta$ | $\Omega$ |
|---|---|---|
| 125° C. | 60° | 16° |
| 230° C. | 60° | 19° |
| 440° C. | 55° | 29° |
| 560° C. | 48° | 50° |

Figure 3:
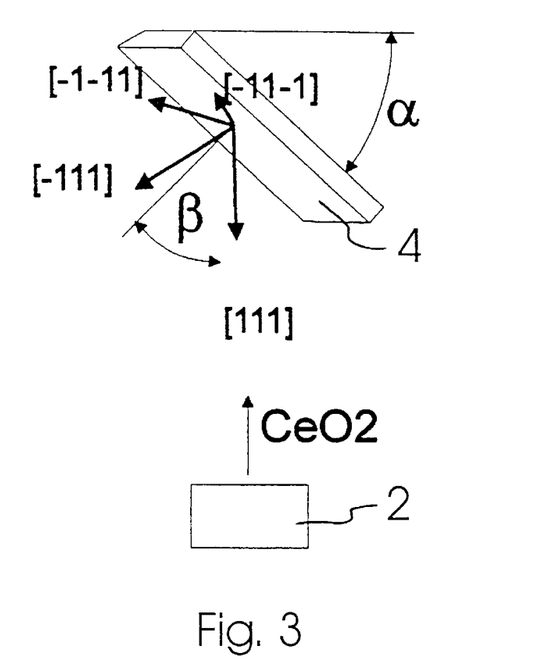
FIG. 3 shows an orientation of CeO$_2$ layers produced by inclined evaporation.

In the case of deposition on a substrate inclined at $\alpha_1$=55°, the buffer and cover layers, as shown in FIG. 3, are oriented (growth area 1). The [111] axis is in the plane spanned by the substrate normal and a deposition direction and forms the inclination angle $\beta$ with substrate normals. The [−111] axis likewise lies in this plane but points approximately in the substrate normal direction. The [−1-11] and [−11-1] axes are aligned and accordingly point upward. The [0−11] crystal axis is then parallel to the substrate surface and perpendicular to the [111] axis. The quality of the biaxial texture was determined with the aid of CeO$_2$-(111) pole figure measurements.

The half-width value $\Omega$ of the [−1-11] and [−11-1] reflexes in the substrate plane are given in Table 5 as a measure of the monocrystalline quality of the layers. The half-width value $\Omega$ increases directly with deposition temperature and the inclination angle $\beta$ decreases at the same time.

Figure 6:
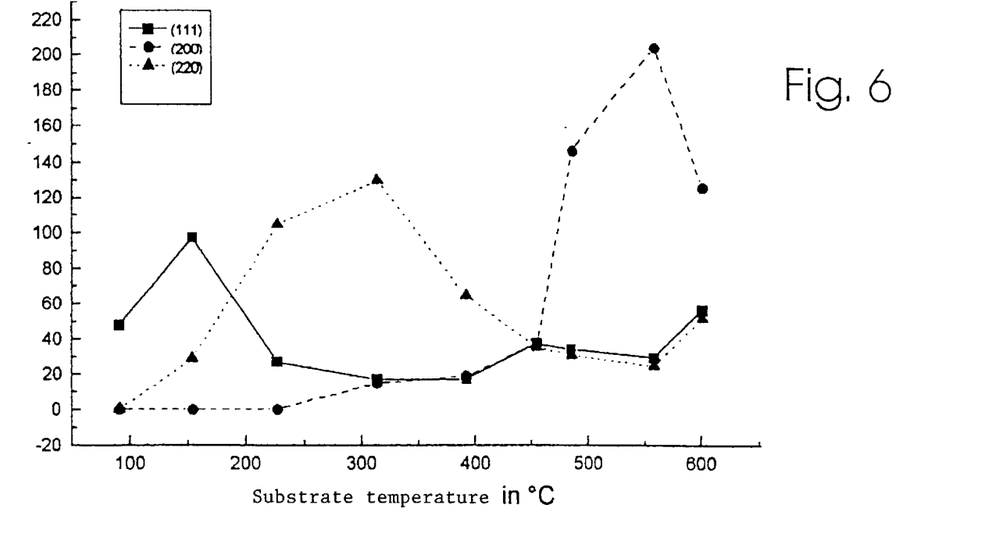
FIG. 6 shows the intensity of the (111), (200), and (220) x-ray diffraction reflexes of CeO$_2$ layers evaporated at right angles at various substrate temperatures.

By contrast, in deposition on a vertical ($\alpha_1$=0) or only slightly inclined substrate, depending on the substrate temperature, different crystal axes are aligned perpendicularly to the surface as shown in FIG. 6. This corresponds to growth range II. In FIG. 6 the intensity of the (111), (200), and (220) x-ray diffraction reflexes of CeO$_2$ layers that are evaporated perpendicularly at various substrate temperatures are represented graphically.

Figure 7:
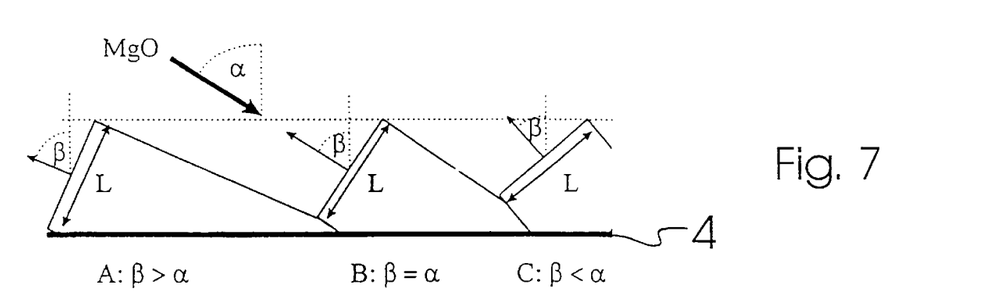
FIG. 7 is a diagram of a viewed initial position during deposition on crystals inclined differently.

The effect of inclining the texture axis relative to the substrate normals will now be described in greater detail with reference to schematic diagrams in FIGS. 7 to 10. Initially a qualitative determination must be made as to the angle $\beta$ at which the <100> axis is preferably inclined when deposition takes place at a certain angle $\alpha$. In other words, a determination is made as to what the orientation of the <100> axis must be so that crystallites that are differently oriented will be shaded as deposition continues. For simplification, parallelipipedic crystallites will be used as examples (FIG. 7) in which, in addition to the <111> axis, a <100> axis lies in the deposition plane and is inclined at various angles $\beta$ to the substrate normal, namely $\beta>\alpha$(A), $\beta=\alpha$(B), and $\beta<\alpha$(C). The crystallites should have the same chances of growth, something that is provided by an equal surface (especially the cross sectional length L), a uniform level of their peaks, and a mutual spacing that is so large that at the beginning there is no shading of any kind. FIG. 7 shows the original situation under discussion during deposition on crystallites inclined differently in a diagram.

Figure 8:
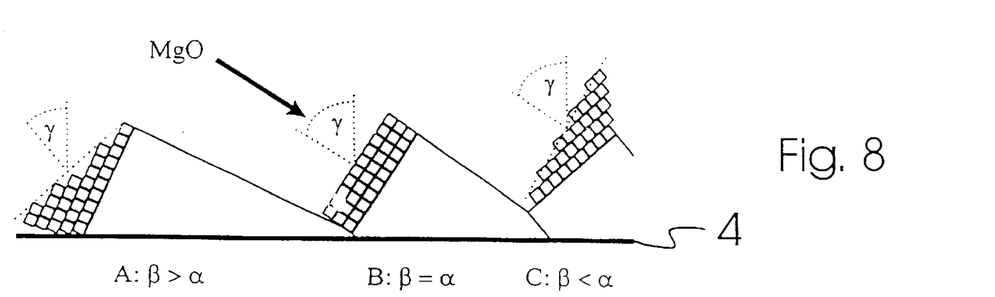
FIG. 8 is a schematic view of the situation in FIG. 7 following a certain period of deposition.

If we disregard isotropic thermally induced diffusion, the molecules deposited on the surface migrate in the direction of their lateral velocity component $v_{II}$ (the speed comes from the gas phase, see the discussion of directed diffusion above). Accordingly, growth in case B takes place parallel to the surface, while in case A the molecules collect preferentially at the lower area of the crystallite and in case C at the tip (FIG. 8). As was assumed earlier, the molecules can even drift over the edge of the substrate. This also explains the vertical growth of columns that has been observed. In FIG. 8 the situation in FIG. 7 is shown after a certain deposition time.

In general it is clear that case C is the preferred orientation, since it grows upward most rapidly and suppresses all other growth forms by increasingly shading them. Thus, $\beta<\alpha$. In addition one can see that the normal of the resultant macroscopic surface of the crystallites gradually tilts in the deposition direction. In fact, in the evaluation of scanning electron microphotographs, one can see from the stripes on both the RHEED pictures that the angle $\gamma$ between the normals of the substrate and the surface of the column peaks increases with layer thickness.

Figure 9:
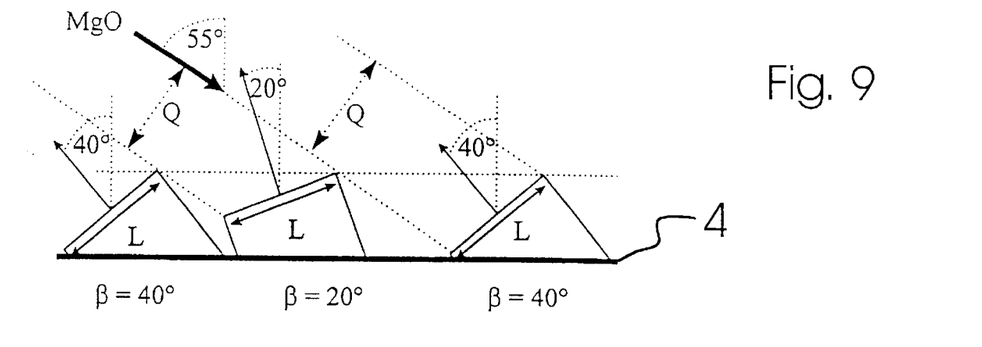
FIG. 9 is a schematic view of an initial situation with crystals inclined differently.
Figure 10:
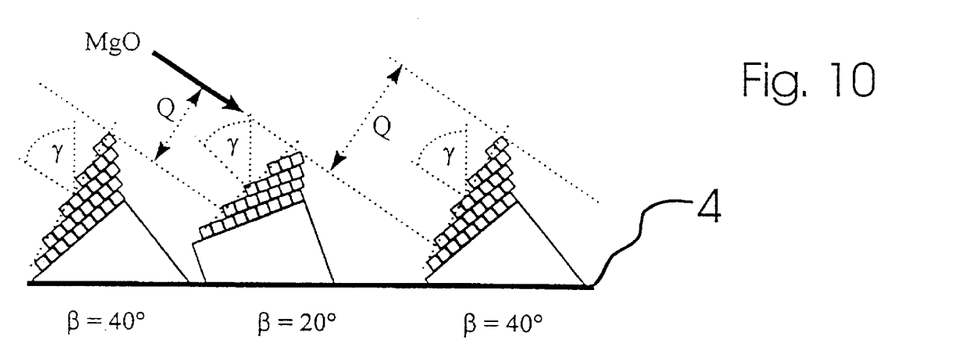
FIG. 10 shows the effect of deposition for a certain space of time on the initial situation in FIG. 9 in a diagram.

The effect of the molecules collecting on the crystalline edge is greatest when $v_{II}$ is maximum, corresponding to $\beta=0°$. In order to understand that the preferred $\beta$ nevertheless does not disappear, one must consider that the particle flow that lands on the crystallite surface increases with the "effective cross section" Q of the area, in other words with constant L proportionally to cos ($\alpha-\beta$). The resultant situation is shown in FIGS. 9 and 10. Under the same assumptions as in FIG. 7, two crystallites with $\beta$=40° and $\beta$=20° and their mutual shading are considered when deposition takes place at an angle of 55°.

FIG. 9 shows that at the starting time in question, the crystallite peaks are at the same level and the cross sections L are identical. The effective cross section Q however is proportional to cos ($\alpha-\beta$).

Since more molecules per unit time are deposited on the crystallite that is inclined more sharply, Q increases with time for the latter, while the effective cross section for the more flatly oriented crystallite is smaller because of shading (FIG. 10). In FIG. 10 it is shown schematically how after a certain deposition time the crystallites with $\beta$=40° shade the more gradually inclined crystallites than the other way around.

The more sharply inclined orientation will therefore prevail. For the same reason, surface angle γ is not larger than α but, as has been observed, the steady-state case becomes established following prolonged deposition such that the maximum cross section is reached when the surface of the column peaks is perpendicular to the beam. Accordingly the resultant surface is not a [100] surface but only vicinal to it. For the adjustment of the In plane or the biaxial texture it is critical that the <111> direction in the case of MgO for example be the preferred or fastest growing direction. In this way crystallites grow the fastest whose <111> direction is as normal as possible to the surface. On the other hand, this means that in the ideal case the plane of incidence represents a (01–1) area. This results in the biaxial texture observed.

In general, therefore, with diagonal deposition, a texture will crystallize out in which (1) the (01–1) surface is parallel to the plane of incidence, (2) the <100> axis forms an angle β with the substrate normal, which is sufficiently small that the molecules drift for a certain distance in the direction of their momentum, and (3) in the light of (2) the axis <100> is inclined as little as possible relative to the deposition direction.

Figure 11:
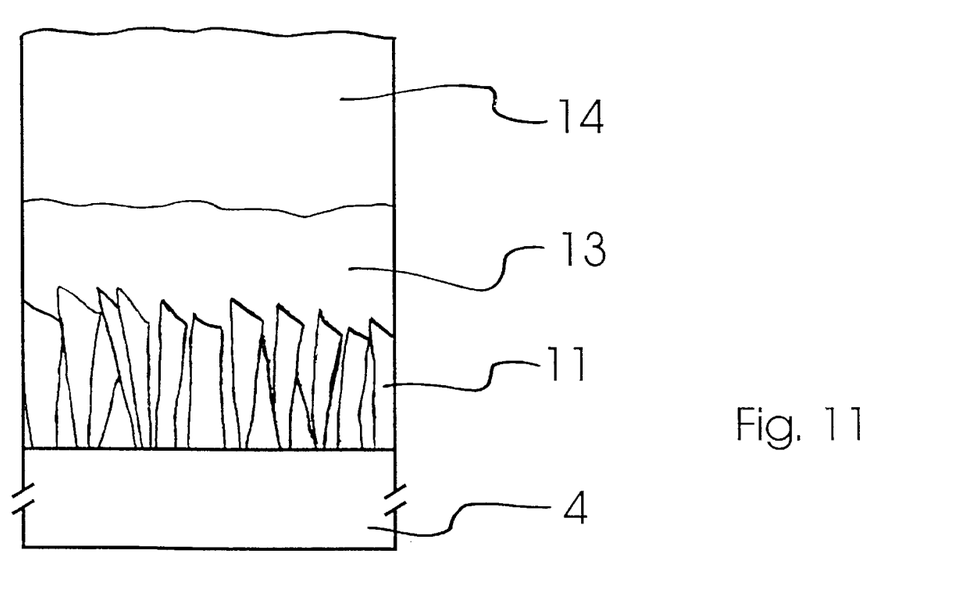
FIG. 11 is a schematic cross sectional view of a part of a laminate.

FIG. 11 shows a schematic cross section through a part of a laminate with the structure according to the invention. In other words, sequentially on top of one another, we have a substrate 4, a buffer layer 11, a cover layer 13, and an oriented oxide thin layer 14. As the diagram clearly shows, buffer layer 11 has a surface that is deeply fractured and nonuniform, and has deep gaps, which does not allow direct epitaxial growth of oriented oxide thin layer 14 at least for a good, especially an at least approximately monocrystalline quality. The surface structure of the buffer layer can be improved by cover layer 13 according to the invention that is evaporated at a different angle on substrate 4 than buffer layer 11; for example it is smoothed and leveled so that outstanding preconditions are created for epitaxial growth of oriented oxide thin layer 14. Instead of the one cover layer 13, a plurality of cover layers can be provided, evaporated at the same or different angles and consisting of the same or different materials. The evaporation angle and the materials of buffer layer 11 and cover layer 13 can likewise be different or the same.

An embodiment will now be described with reference to an epitaxy of YBCO on MgO with reference to FIGS. 12 to 15. The necessity of several MgO layers as buffers and cover layers will be explained for the epitaxy of $YBa_2Cu_3O_{7-\delta}$ on MgO.

Figure 15:
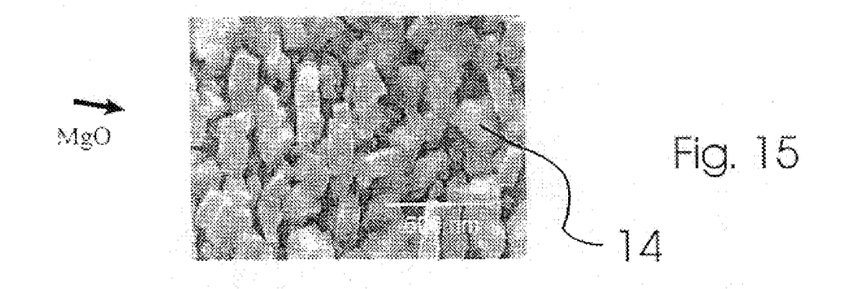
FIG. 15 is a scanning electron microphotograph of a YBCO layer applied directly on a buffer layer.

It is clear from the above that it is possible to achieve texturing of MgO using ISD which leads one to expect good superconducting properties in the epitaxy of $YBa_2Cu_3O_{7-\delta}$. however it turns out that the HTSL films that are deposited on lSD-MgO do not assume the biaxial texture of the buffer but grow in a polycrystalline manner (FIG. 15). FIG. 15 is a scanning electron photomicrograph of a YBCO film evaporated directly on an lSD layer of MgO.

Accordingly, the measured $T_c$ is only 20K. The subsequent growth of YBCO, at least with the process used, appears therefore not to depend exclusively on the texture of the buffer but on its morphology as well.

Two circumstances appear to have an unfavorable effect on the epitaxial growth of vertically deposited $YBa_2Cu_3O_{7-\delta}$. They are an insufficient density of the columnar layers and the fact that the surfaces a of the column peaks are not oriented exactly in the <100> direction.

For this reason a decision was made to deposit additional MgO cover layers perpendicularly on the ISD layer before the HTSL layer. These cover layers are intended to assume the texture of the ISD layer and to fill up the gaps between the growth columns as well as to "level off" and smooth the column surfaces.

The experiments that were performed show that homoepitaxy functions theoretically and improves with increasing substrate temperature. For this reason it is especially advantageous to utilize an equilibrium radiant heater since temperatures up to 750° C. can be reached with it. Under these conditions, in fact, the best results were obtained as far as homoepitaxy was concerned, provided the deposition rate was sufficiently low.

For example, RHEED pictures (RHEED=reflection high energy electron diffraction) were taken during the deposition of a cover layer 500 nm thick (substrate temperature 734° C., deposition rate 30 nm/min). The <100> inclination angle β can be determined from the transmission diffraction picture while the surface angle γ corresponds to the inclination of the stripes that appear. In this embodiment for example, prior to the beginning of deposition, the surfaces of the ISD layer can be inclined at approximately 37° relative to the substrate normals. Within the scope of low measurement accuracy, this is consistent with the assumption stated above that the surface normal gradually tends toward the deposition direction (α=35°). It is also found that during cover layer deposition the angle β is constantly approximately 26°, indicating good epitaxy. Finally it can be seen that surface angle γ decreases at the same time and tends toward a boundary value identical with β. As a result, a film is obtained whose microscopic surfaces are exact (100) surfaces.

Figure 12:
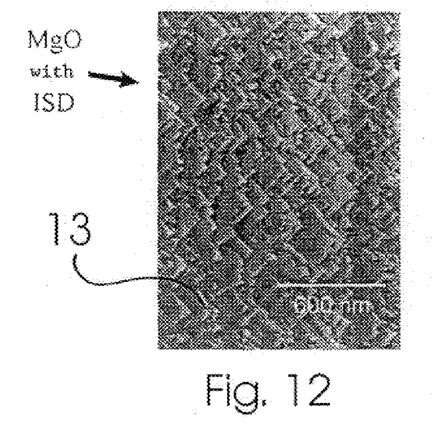
FIG. 12 is a scanning electron microphotograph of a cover layer made of MgO.

This is particularly evident in scanning electron photomicrographs. FIG. 12 shows the surface of a sample of a layer material that initially consists of three layers of MgO. More exactly, FIG. 12 is a top view of the uppermost layer of MgO in a three layer sample. The gaps are closed, and the surface consists of sharply delimited crystallites with exact (100) faces.

The first buffer layer is produced by ISD. The deposition parameters were T=25° C., α=25°, R=240 nm/min, p=9×$10^{-4}$ mbar, and D=2 μm. The two following cover layers are evaporated perpendicularly at 700° C. at the same oxygen pressure, and initially a layer 500 nm thick is applied at 30 nm per minute and then a thin layer (100 nm) is applied at 6 nm/min, which results in surfaces that are especially defined crystallographically as a result of the slow rate. In addition, the originally present gaps in the ISD layer were closed.

The following is a more detailed description of properties of $YBa_2Cu_3O_{7-\delta}$ films.

Figure 13:
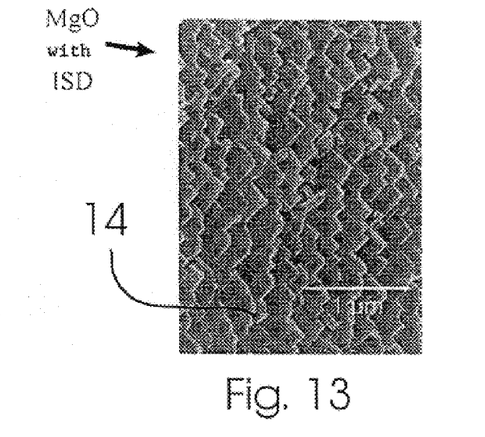
FIG. 13 is a scanning electron microphotograph of a YBCO layer on the cover layer in FIG. 12.

YBCO layers that are precipitated by reactive co-evaporation on layer systems of the type described above are characterized by a highly ordered structure. In the scanning electron microphotograph of a film 570 nm thick that was evaporated on the buffer/cover layer structure shown in FIG. 12, it is clearly evident that the morphology of the magnesium oxide has taken over (FIG. 13). More precisely, FIG. 13 shows the surface of the sample in FIG. 12 following evaporation with YBCO.

In a comparison of the respective scales, however, it becomes apparent that the YBCO crystallites are far larger than those of magnesium oxide and the latter therefore are partially overgrown. In contrast to the HTSL layers on YSZ, $CeO_2$ and monolayer MgO however, there are no perpendicular orientations of a-axes to be seen in the picture, but there is a uniform c-axis texture. The completed heteroepitaxy is especially clear in the (103) pole figures. These are preferred since they permit an optimum determination of the orientation and half-width value owing to the maximum intensity of the reflections. The pole figure that belongs to the film shown in FIG. 13 as the surface of the layer material is shown in FIG. 14.

Figure 14:
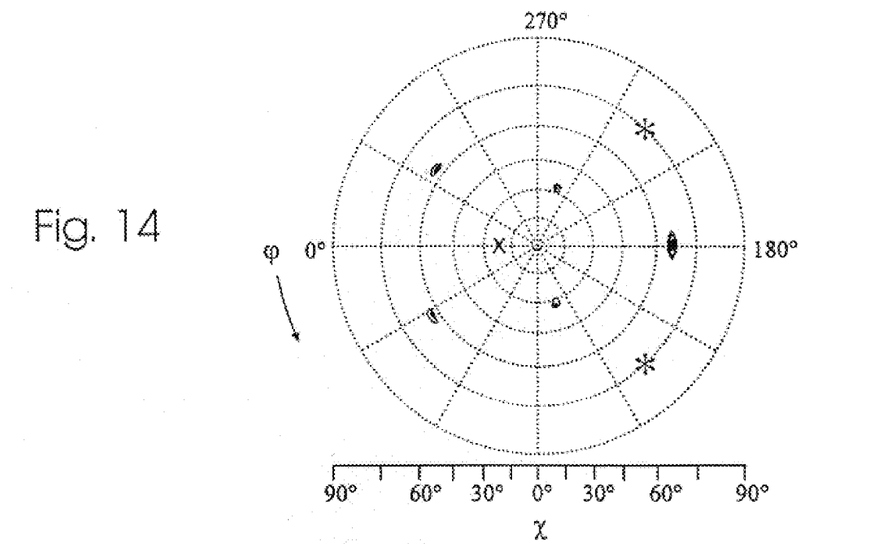
FIG. 14 is a pole figure of the YBCO layer shown in FIG. 13.

FIG. 14 shows a YBCO-(103) pole figure of the sample discussed in FIGS. 12 and 13. The directions of the a-axes (*) as well as those of the c-axis (X) are plotted. In addition, the positions of the a-axes (*) as well as the c-axis (x) are plotted that are determined from (200) and (005) pole figures. There is a c-axis inclination of 23.7° as well as a (103) half-width value of 11°, while the corresponding values for the buffer layer are $\beta=25.3°$ and FWHM=12°.

These pole figures confirm in an impressive matter the cube-on-cube growth of YBCO on MgO and demonstrate that the texture is even improved over the buffer layer. The inductive measurements of transition temperature and jC for this sample yield values of 85.4K and $1.39 \times 10^5$ A/cm$^2$. In order to make a comparison, MgO monocrystals were evaporated in parallel with the ISD samples. Here $j_c$ is more than $2 \times 10^6$ A/cm$^2$ and $T_c$ is a maximum of 88K. The best results obtained thus far with ISD were with a sample containing $T_c=85.6K$ and $j_c=2.80 \times 10^5$ A/cm$^2$ where $\beta=18.5°$ and FWHM=16°. The production of the sample was identical with that for the sample shown in FIGS. 12 and 13 with the exception that the substrate temperature (45° C.) and α (15°) were different during the deposition of the first MgO layer. The crystallographic results for the MgO layers are $\beta=19°$ and FWHM=22°.

From the equipment and method standpoint therefore the following features and properties are important either individually or in combination: evaporation angle $\alpha_1$ of the buffer layer and possibly $\alpha_2$ to $\alpha_n$ of cover layers 2 to n, a pressure increase in the evaporation area or layer-forming area close to the substrate, no limitation to metal oxides, specially biaxially textured MgO layers, especially biaxially textured CeO$_2$ layers, deposition on a moving substance, simultaneous application of several layers to a strip using an evaporation source, and simultaneous application of buffer and cover layers and superconductors.

It is especially true of the cover layers located on the buffer layer that they can be evaporated at a higher temperature and a lower rate so that they grow epitaxially and/or the inclination angles $\alpha_2$ to $\alpha_n$ of the 2 to n cover layers 13 are chosen so that the pores in buffer layer 11 are closed. In an MgO buffer layer, one or preferably two cover layers made of MgO can be specially provided.

The invention has been described above with reference to a few sample embodiments in greater detail, with references to the drawing in which the same or similar parts and components have been given the same reference numbers in all the figures. The sample embodiments described above in greater detail however do not constitute a limitation of the invention. The scope of the invention is determined by the claims, the preamble to the specification, and the description of the figures together with the drawing and everything that the individual skilled in the art would be able to derive from the entire documentation provided with the aid of his professional knowledge, and the literature cited herein falls completely within the scope of disclosure. The invention includes in particular all modifications, substitutions, and changes that lead to the same or similar results as well as the effects that are covered by the statements in the claims.

What is claimed is:

1. A device for producing a laminate, comprising:
   a vacuum chamber;
   positioning devices for a substrate;
   buffer layer material dispensing devices for providing a buffer layer;
   cover layer material dispensing devices for forming at least one cover layer; and
   devices for evaporating a material for the at least one cover layer onto the buffer layer under deposition conditions that are different from those under which the buffer layer was applied, wherein the deposition conditions are selected from the group consisting of a different pressure, a different temperature, a different rate, and a different angle,
   wherein the positioning devices and the buffer layer dispensing devices are so arranged that a buffer layer material is evaporated from the buffer layer material dispensing devices at an angle $\alpha_1 \neq 0$ to the normal to a substrate surface onto the substrate,
   wherein the cover layer material dispensing devices are arranged relative to the substrate positioning devices such that the cover layer material is applied at an angle $\alpha_2 \neq \alpha_1$ to the substrate surface normal to the buffer layer.

2. A device according to claim 1, further comprising devices for thermal evaporation for at least one of the buffer layer material, the cover layer material, or the material for oriented thin layer.

3. A device according to claim 1, wherein angle $\alpha_1$ is larger than an angle β which a crystal axis of the buffer layer material forms with the substrate surface normal, with an additional crystal axis of the buffer layer material being parallel to the substrate surface.

4. A device according to claim 1, further comprising devices for producing and maintaining a pressure that is higher by comparison with the remainder of the vacuum chamber in the vicinity of the application of the buffer layer material and optionally of the cover layer material and/or of the material for the oriented thin layer on the respective substrate.

5. A device according to claim 1, further comprising devices for adding volatile components during the evaporation of the respective material or materials and/or components that are required for producing buffer layer and optionally cover layer and/or oriented thin layer and/or reactive components in gas form.

6. A device according to claim 1, wherein the substrate positioning devices is designed so that the substrate, at least in a first layer formation area:
   (a) is arranged inclined relative to the horizontal so that the buffer layer material rises at least approximately vertically to the horizontal from the buffer layer material dispensing devices, in the first layer formation area reaches substrate at an angle $\alpha_1 \neq 0$ to the normal to the substrate surface; or
   (b) is arranged at least approximately parallel to the horizontal and the buffer layer material dispensing devices are arranged relative to the first layer formation area such that buffer layer material that rises at an angle to the horizontal from the buffer layer material dispensing devices, in the first layer formation area, reaches substrate at an angle $\alpha_1 \neq 0$ to the normal to the substrate surface.

7. A device according to claim 1, wherein the substrate positioning devices is designed so that the substrate with buffer layer, at least in a second layer formation area:
   (a) is arranged at an angle to the horizontal such that cover layer material that rises at least approximately perpendicularly to the horizontal from cover layer material dispensing devices, in the second layer formation area, reaches buffer layer on substrate at least approximately at angle $\alpha_2 \neq \alpha_1$ to the normal to the substrate surface; or (b) is arranged at least approximately parallel to the horizontal and the cover layer material dispensing devices are so arranged and the cover layer material dispensing devices are arranged relative to the second layer formation area in such fashion that cover layer material that rises at an angle to the horizontal from the cover layer material dispensing devices in the second layer formation area reaches buffer layer on substrate at least approximately at angle $\alpha_2 \neq \alpha_1$ to the normal to the substrate surface.

8. A device according to claim 1, wherein the substrate positioning devices include at least one of a substrate holder for substrates movable therein or a substrate guide for continuously conveyed substrates in the shape of strips or cables.

9. A device according to claim 4, wherein the devices for creating and maintaining a pressure comprise a pressure-increasing device having multiple passages or a plurality of pressure-increasing devices with evaporating stations located in between and wherein the pressure-increasing device is designed to provide a pressure of at least approximately $\geq 5 \times 10^{-4}$ mbar relative to a pressure of approximately $\leq 1 \times 10^{-4}$ mbar at the source in a layer formation area or in an area where a layer or a partial layer has already formed.

10. A device according to claim 9, wherein the pressure-increasing device is designed to provide a pressure of approximately $\geq 1 \times 10^{-3}$ mbar relative to a pressure of approximately $\leq 2 \times 10^{-5}$ mbar at the source in a layer formation area or in an area where a layer or a partial layer has already formed.

11. A method for producing laminate, comprising:
applying a buffer layer to a substrate, wherein the buffer layer material is evaporated from buffer layer material dispensing devices at an angle $\alpha_1 \neq 0$ to the normal to a substrate surface;
applying at least one cover layer under deposition conditions that are different from those under which buffer layer was applied, wherein the deposition conditions are at least one of a different pressure, different temperature, different rate, and a different angle $\alpha_2 \neq \alpha_1$ to the substrate surface normal; and
evaporating an oriented thin layer.

12. A method according to claim 11, wherein at least one of the buffer layer material, the cover layer material, or the material for the oriented thin layer is applied by thermal evaporation.

13. A method according to claim 11, wherein the angle $\alpha_1$ is larger than an angle $\beta$ that a crystal axis of the buffer layer material forms with the substrate surface normal, with an additional crystal axis of the buffer layer material being parallel to the substrate surface.

14. A method according to claim 11, wherein the area of application of the buffer layer material and optionally of the cover layer material and/or of the material for oriented thin layer on the respective substrate, a pressure prevails that is higher by comparison to the other vacuum conditions.

15. A method according to claim 11, wherein the area of the application of the buffer layer material and optionally of the cover layer material and/or the material for oriented thin layer on the respective substrate, volatile components and/or components is gas form required for producing buffer layer or cover layer and/or oriented thin layer, and/or reactive components, is/are added during evaporation of the respective material and/or materials.

16. A method according to claim 11, wherein $\alpha 2 < \alpha 1$.

17. A method according to claim 16, where $\alpha 2 \neq 0°$.

18. A method according to claim 11, wherein the buffer layer has a biaxial texture or facets.

19. A method according to claim 11, where in the thermal evaporation is electron beam evaporation or reactive evaporation.

20. A method according to claim 11, wherein the oriented thin layer is at least one layer selected from the group consisting of an oxide, a metal thin layer, a high-temperature superconductor layer, a ferromagnetic layer, and a ferroelectric layer.

21. A method according to claim 20, wherein the high-temperature superconductor layer is a YBCO layer.

22. A method according to claim 20, wherein a plurality of oriented thin layers is located one on top of the other on the at least one cover layer.

23. A method according to claim 20, wherein at least one of the buffer layer or the cover layer comprises an oxide material selected from the group consisting of MgO, $CeO_2$, and $Y_2O_3$-stabilized zirconium oxide.

24. A method according to claim 20, wherein the substrate comprises a heat-resistant metal or has a metal alloy surface with an amorphous or polycrystalline structure that faces the oriented thin layer.

25. A method according claim 11, wherein the substrate, in a first layer formation area,
(a) is arranged at an angle to the horizontal such that buffer layer material that rises at least approximately perpendicularly to the horizontal from the buffer layer material dispensing devices reaches substrate in the first layer formation area at an angle $\alpha_1 \neq 0$ to the normal to the substrate surface, or
(b) is arranged at least approximately parallel to the horizontal, and buffer layer material is evaporated relative to the first layer formation area so that buffer layer material that rises at an angle to the horizontal from buffer layer material dispensing devices, in the first layer formation area, reaches substrate at an angle $\alpha_1 \neq 0$ to the normal to the substrate surface.

26. A method according claim 11, wherein the substrate, with buffer layer, at least in a second layer formation area,
(a) is inclined at an angle to the horizontal such that cover layer material that rises at least approximately perpendicularly to the horizontal from the cover layer material dispensing devices in the second layer formation area reaches buffer layer on substrate at least approximately at angle $\alpha_2 \neq \alpha_1$ to the normal to the substrate surface, or
(b) is located at least approximately parallel to the horizontal, and cover layer material is evaporated relative to the second layer formation area such that cover layer material that rises at an angle to the horizontal from the cover layer material dispensing devices, in the second layer formation area, reaches buffer layer on substrate at least approximately at angle $\alpha_2 \neq \alpha_1$ to the normal to the substrate surface.

27. A method according to claim 11, wherein strip or cable substrate material is delivered continuously or that a substrate is arranged movably and/or that in a layer formation area or in an area where a layer or a partial layer has already been formed, a pressure is produced or maintained that is higher than the remaining vacuum conditions, whereby multiple passages through a pressure-increasing device and/or successive passage through several pressure-increasing devices takes place with evaporation stations located therebetween.

28. A method according to claim 27, wherein, in a layer-formation area or in an area where a layer or a partial layer has already been formed, a pressure of at least approximately $\geqq 5\times 10^{-4}$ mbar relative to a pressure of approximately $\leqq 1\times 10^{-4}$ mbar is provided at the source.

29. A method according to claim 11, wherein at least one of the buffer layer or the at least one cover layer comprises an oxide material selected from the group consisting of MgO, $CeO_2$, and $Y_2O_3$-stabilized zirconium oxide.

30. A method according to claim 11, wherein the substrate comprises a heat-resistant metal or has a metal alloy surface with an amorphous or polycrystalline structure that faces the oriented thin layer.

31. A method according to claim 30, wherein the metal alloy surface is polished or heat-resistant.

32. A method according to claim 30, wherein the substrate or the metal alloy surface is selected from the group consisting of thermally oxidized silicon, a nickel-based alloy, partially $Y_2O_3$-stabilized $ZrO_2$, heat-resistant stainless steel, platinum, and $Al_2O_3$, each in the polycrystalline or amorphous form.

* * * * *